United States Patent
Lau

(10) Patent No.: US 9,762,211 B2
(45) Date of Patent: Sep. 12, 2017

(54) SYSTEM AND METHOD FOR ADJUSTING DUTY CYCLE IN CLOCK SIGNALS

(71) Applicant: Samsung Electronics Co., Ltd., Gyeonggi-do (KR)

(72) Inventor: Chung Y Lau, Sunnyvale, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/994,767

(22) Filed: Jan. 13, 2016

(65) Prior Publication Data

US 2017/0126211 A1     May 4, 2017

Related U.S. Application Data

(60) Provisional application No. 62/250,274, filed on Nov. 3, 2015, provisional application No. 62/251,842, filed on Nov. 6, 2015.

(51) Int. Cl.
*H03K 3/017* (2006.01)

(52) U.S. Cl.
CPC .................. *H03K 3/017* (2013.01)

(58) Field of Classification Search
CPC .............................. H03K 5/1565; H03K 3/017
USPC .................. 327/175, 170, 172–174
See application file for complete search history.

(56) References Cited

U.S. PATENT DOCUMENTS

| | | | |
|---|---|---|---|
| 6,384,620 B1 * | 5/2002 | Yamada | H03K 5/007 326/29 |
| 6,771,136 B1 | 8/2004 | Reynolds | |
| 6,801,585 B1 * | 10/2004 | Nguyen | H03D 7/1441 375/327 |
| 7,570,094 B2 | 8/2009 | Mnich | |
| 7,671,651 B2 | 3/2010 | Kim | |

* cited by examiner

*Primary Examiner* — Thomas Skibinski
(74) *Attorney, Agent, or Firm* — The Farrell Law Firm, P.C.

(57) ABSTRACT

A device and method are disclosed. The device and method allow the clock signal of a wireless communication device to produce an oscillation with a 50% duty cycle. The device and method allows quick convergence to a 50% duty cycle after power up and also provides stability of the duty cycle across variations in ambient temperature and power supply fluctuations. The device includes, but is not limited to a buffer, a first inverter electrically coupled to the buffer, a second inverter electrically coupled to the first inverter, and a differential integrator, wherein a first output of the first inverter is electrically coupled to a first input of the differential integrator, wherein a second output of the second inverter is electrically coupled to a second input of the differential integrator, and wherein a third output of the differential integrator is electrically connected to the buffer.

21 Claims, 2 Drawing Sheets

SYSTEM AND METHOD FOR ADJUSTING DUTY CYCLE IN CLOCK SIGNALS

PRIORITY

The present application claims priority under 35 U.S.C. §119(e) to U.S. Provisional Application Nos. 62/250,274, and 62/251,842, which were filed in the U.S. Patent and Trademark Office on Nov. 3, 2015 and Nov. 6, 2015, respectively, the content of each of which is incorporated herein by reference.

FIELD OF THE DISCLOSURE

The present disclosure generally relates to generating clock signals and more particularly, to a system and method for adjusting the duty cycle in a clock signal.

BACKGROUND

A crystal oscillator, such as a temperature compensated crystal oscillator (TCXO), provides a reference frequency for various phase-locked loops (PLLs) inside a typical radio frequency integrated circuit (RFIC), as well as providing clocks for various processors. These PLLs are necessary blocks for radios, for example, Wi-Fi, cellular, global navigation satellite system (GNSS), and Bluetooth.

As communications systems evolve, there is a need to develop very low-noise PLLs to synthesize very low-noise local oscillator signals used in a transmitter and/or a receiver of a radio. A higher reference frequency for a PLL generally improves the phase noise of the PLL. Therefore, it is desirable to have the option of using twice the crystal oscillator frequency as a reference clock to the PLL. The reference clock is typically implemented by a frequency doubling circuit that may be part of, or outside the PLL, using both the rising edge and the falling edge of the reference clock. For such applications, it is important that the frequency doubling circuit has an input clock that is as close to symmetrical, or 50% duty cycle, as possible. This reduces the level of the unwanted sub-harmonics in the double-frequency output from the frequency doubling circuit.

SUMMARY

The present disclosure has been made to address the above problems and disadvantages and to provide at least the advantages described below.

In accordance with an aspect of the present disclosure, a device is provided which includes, but is not limited to a buffer, a first inverter electrically coupled to the buffer, a second inverter electrically coupled to the first inverter, and a differential integrator, wherein a first output of the first inverter is electrically coupled to a first input of the differential integrator, wherein a second output of the second inverter is electrically coupled to a second input of the differential integrator, and wherein a third output of the differential integrator is electrically connected to the buffer.

In accordance with another aspect of the present disclosure a method is provided which includes, but is not limited to the steps of generating a buffered clock signal based on providing a clock signal to a buffer, generating a first clock signal based on providing the buffered clock signal to a first inverter, generating a second clock signal based on providing the first clock signal to a second inverter, generating an output signal from a differential integrator based on providing a first voltage level of the first clock signal and a second voltage level of the second clock signal to the differential integrator, biasing a threshold of the buffer based on providing the output signal from the differential integrator to the buffer.

BRIEF DESCRIPTION OF THE DRAWINGS

The above and other aspects, features and advantages of the present disclosure will become more apparent from the following detailed description, when taken in conjunction with the accompanying drawings, in which.

DETAILED DESCRIPTION

Figure 1:
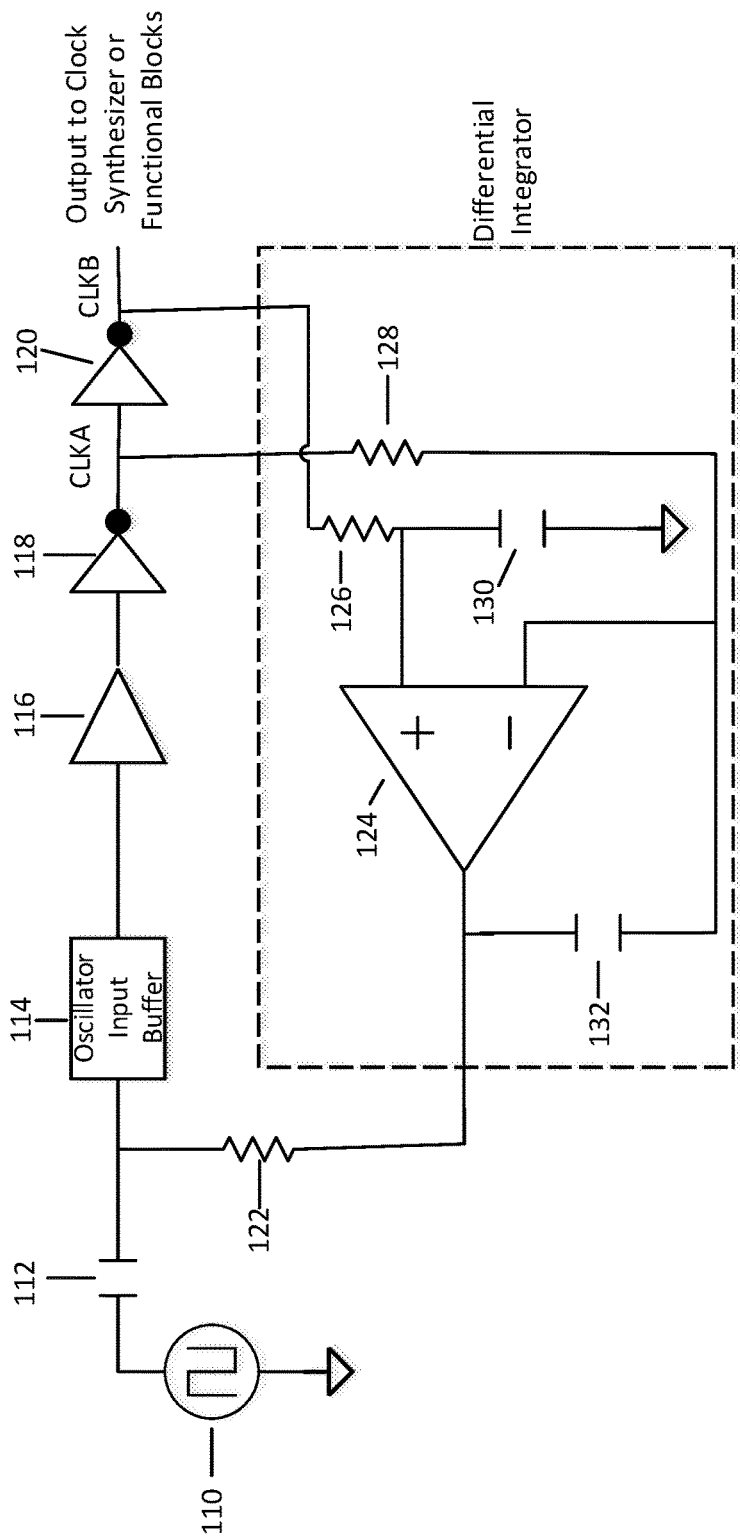
FIG. 1 is a schematic diagram of an exemplary system for controlling the duty cycle of a reference clock, according to an embodiment of the present disclosure.

The present disclosure will now be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the device and method to those skilled in the art. In the drawings, the size and relative sizes of layers and regions may be exaggerated for clarity. Like reference numbers refer to like elements throughout.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes, but is not limited to any and all combinations of one or more of the associated listed items.

It will be understood that, although the terms first, second, and other terms may be used herein to describe various elements, these elements should not be limited by these terms. These terms are only used to distinguish one element from another. For example, a first signal could be referred to as a second signal, and, similarly, a second signal could be referred to as a first signal without departing from the teachings of the disclosure.

The terminology used herein is for the purpose of describing particular embodiments only and is not intended to be limiting of the present device and method. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present device and method belongs. It will be further understood that terms, such as those defined in commonly used dictionaries, should be interpreted as having meanings that are consistent with their meaning in the context of the relevant art and/or the present description, and will not be interpreted in an idealized or overly formal sense unless expressly so defined herein.

The frequency synthesizer(s) within a mobile wireless communications device is typically supplied by a reference clock. The reference clock has a unique frequency of oscillation, stability level, temperature drift, power consumption and duty cycle. The reference clock provides a stable clocking signal to the frequency synthesizer and also to multiple functional blocks including processors, memory, and communications blocks. It is often desirable to use a frequency doubling circuit to generate twice the reference clock frequency to use as a higher frequency reference for a high performance synthesizer. For the frequency doubling circuit to perform well, a reference clock or input clock to the frequency doubling circuit must be as close to symmetrical, or having a 50% duty cycle, as possible. A commercial TCXO typically has duty cycles in the range of 45% to 55%. The present system and method controls and modifies the duty cycle of a reference clock to achieve a duty cycle as close to 50% as possible.

FIG. 1 is a schematic diagram of an exemplary system for controlling the duty cycle of a reference clock, according to an embodiment of the present disclosure. An oscillator 110 provides a frequency source such as a crystal clock to an oscillator input buffer 114. The oscillator 110 is typically external to an integrated circuit (IC) that includes, but is not limited to the rest of the components illustrated in FIG. 1. For example, the oscillator 110 is a TCXO with a very stable frequency over a wide range of temperatures. In an embodiment of the present disclosure, the oscillator 110 may lack temperature compensation. The oscillator 110 is capacitively coupled to the oscillator input buffer 114 through a capacitor 112. According to an embodiment of the present disclosure, the oscillator input buffer 114 is an inverter with a large resistor between its input and output pins. The output clock of the oscillator input buffer 114 is supplied to a buffer 116 (e.g., a CMOS buffer) that sharpens the edges of the output clock of the oscillator input buffer 114, i.e., reduces the rise time and fall time of the output clock. The oscillator input buffer 114 inverts the input signal to the oscillator input buffer 114. It is appreciated that the buffer 116 may include an even number of inverters to sharpen the edges of the output clock of the oscillator input buffer 114, without deviating from the scope of the disclosure. Upon power up, or without any correction, the duty cycle of the buffered clock that is output from the buffer 116 and entering the inverter 118 may vary across a range of 45% to 55% depending on factors including oscillator 110 asymmetry, oscillator input buffer 114 asymmetry and buffer 116 asymmetry, as well as the effects of parasitic impedances within the circuit path from the oscillator 110 to the inverter 118.

Embodiments of the present disclosure provide a circuit capable of correcting the duty cycle of the clock signal to as close to 50% as possible. In order to adjust the duty cycle of the reference clock (CLKB) that is output by the inverter 120, the difference in the outputs of the inverters 118 and 120 are integrated over time using a differential integrator that includes, but is not limited to a differential amplifier 124, a resistor 126, a capacitor 130, a resistor 128 and a capacitor 132. The integrated difference signal appears at the output of the differential amplifier 124 and is used to adjust the threshold of the oscillator input buffer 114, via a resistor 122. The negative feedback forces the difference in the direct-current (DC) voltages of the inverters 118 and 120 to be zero. If the difference in the DC voltages at CLKA and CLKB of the respective inverters 118 and 120 deviates from zero, the differential integrator generates a voltage at the output of the differential integrator that causes the threshold of the oscillator input buffer 114 to change in such a direction as to reduce the difference in the DC voltages at CLKA and CLKB to zero. When the difference in the DC voltages at CLKA and CLKB is at zero, the signals CLKA and CLKB have the same DC voltage level, and that is only possible if the duty cycles of CLKA and CLKB are both at 50%. Any non-50% duty cycle will cause CLKA and CLKB to have different DC voltage levels. CLKA and CLKB have closely matched rise and fall times so that if they have the same DC voltage levels, then they have the same duty cycle. The matching rise and fall times of the inverters 118 and 120 are obtained by matching the physical design of the inverters and the output impedances seen by the inverters.

CLKA and CLKB at the outputs of respective inverters 118 and 120 each have a DC voltage level that is a measure of the duty cycle of the clock signals at CLKA and CLKB. CLKB is an inverted clock signal of CLKA. For example, if CLKA has 40% duty cycle, then CLKB has 60% duty cycle and the DC voltage level at CLKA and CLKB are not the same. Assume that the supply voltage for inverters 118 and 120 is VDD and the logic outputs of inverters 118 and 120 are from 0V to VDD. If CLKA has 40% duty cycle, the DC voltage level at CLKA is 0.4*VDD, and the DC voltage at CLKB is 0.6*VDD. If the duty cycles of CLKA and CLKB are both 50%, the DC voltage levels at CLKA and CLKB are the same, i.e., 0.5*VDD.

In an embodiment of the present disclosure, integration of the difference in outputs of the matched inverters 118 and 120 is achieved by the differential integrator made of differential amplifier 124, resistor 126, resistor 128, capacitor 130 and capacitor 132. Matching of the RC circuits (resistor 126 and capacitor 130 versus resistor 128 and capacitor 132), although not critical, is also achieved by matching the physical design of one or more respective resistors and capacitors. The RC time constant chosen to integrate the output of the inverters 118 and 120 is a function of the fundamental frequency of the oscillator 110. In an embodiment of the present disclosure, for an oscillator 110 with a fundamental frequency of 26 MHz, the value of the capacitors 130 and 132 may be 10 picofarads while the value of the resistors 126 and 128 may be several hundred thousand ohms.

The difference in output voltages of the inverters 118 and 120 is supplied to a differential amplifier 124. The output of the differential amplifier 124 is the integrated value of the difference in the DC voltages between CLKA and CLKB of the respective inverters 118 and 120. Due to the high DC gain of the differential amplifier 124, any difference in the DC voltage at CLKA and CLKB drives the output of the differential amplifier 124 to a voltage supply rail of the differential amplifier 124. If the duty cycle of CLKA and CLKB at the outputs of the respectively matched inverters 118 and 120 is 50%, then the DC voltage values of the output signals of the inverters 118 and 120 are the same and their difference is zero. A difference of zero volts applied to the inputs of the differential amplifier 124 produces a steady DC output voltage that is not railed to either of the voltage supplies of the differential amplifier 124. In an embodiment of the present disclosure, the differential amplifier 124 has attributes which contribute to the overall accuracy of the circuit including a low DC offset, a high DC gain and a low bandwidth. In an embodiment of the present disclosure, the differential amplifier 124 may have a DC offset lower than 1 mv, a DC gain of 80 db and a unity gain bandwidth of 5 MHz.

Embodiments of the present disclosure provide a circuit for modifying the duty cycle of a clock signal and provide a circuit which modifies the duty cycle of a clock signal to as close to 50% as possible. As described above, if the duty cycle of CLKA and CLKB that is output from respective inverters 118 and 120 is 50%, the output of the differential amplifier 124 is at a steady DC voltage and not railed to the voltage supply of the differential amplifier 124. As the duty cycle output from the inverters varies from 50%, the output of the differential amplifier will vary in order to force the duty cycle to 50%.

In an embodiment of the present disclosure, the output of the differential amplifier 124 is supplied back to the input of the oscillator input buffer 114 in order to correct the duty cycle and converge on a clock signal with 50% duty cycle. The output of differential amplifier 124 is supplied back to the oscillator input buffer 114 through resistor 122. The signal supplied back to the oscillator input buffer 114 from the differential amplifier 124 is used as a biasing signal to change the switching threshold of the oscillator input buffer 114. The slew rate of the clock signal entering the oscillator input buffer 114 is not infinitely fast, the rise time and fall time of the clock signal are typically in the range of a few nanoseconds. As the switching threshold of the oscillator input buffer 114 is varied due to the biasing from the differential amplifier 124, the time at which the output of the oscillator input buffer 114 switches is changed, and therefore resulting in the duty cycle at the output of the buffer 114 changing.

In an embodiment of the present disclosure, the oscillator 110 provides a clock signal at its fundamental frequency and a duty cycle that may not be equal to 50%. The clock signal propagates through the oscillator input buffer 114, the buffer 116 and the inverters 118 and 120. The difference between the DC voltage levels at CLKA and CLKB that is output from the respective inverters 118 and 120 are integrated over time by the differential amplifier 124 and the resistor 126, the capacitor 130, the resistor 128 and the capacitor 132. The threshold biasing signal output from the differential amplifier 124 changes in the positive or negative direction due to the duty cycle of the outputs of the inverters 118 and 120 not being 50%. The direction depends on whether the difference is positive or negative, which is the same as whether the duty cycle is higher or lower than 50%. The differential amplifier 124 output provides a threshold biasing signal to the oscillator input buffer 114 which corrects the duty cycle of CLKB. This feedback process forces the duty cycle of CLKB to be as close to 50% as possible. In an embodiment of the present disclosure, the clock signal will converge on 50% duty cycle within 50 microseconds.

In an embodiment of the present disclosure, the elements 110-132 are fabricated in close proximity to each other on the same die using a CMOS process to reduce parasitic impedances and noise which may introduce errors into the duty cycle correcting circuit.

Figure 2:
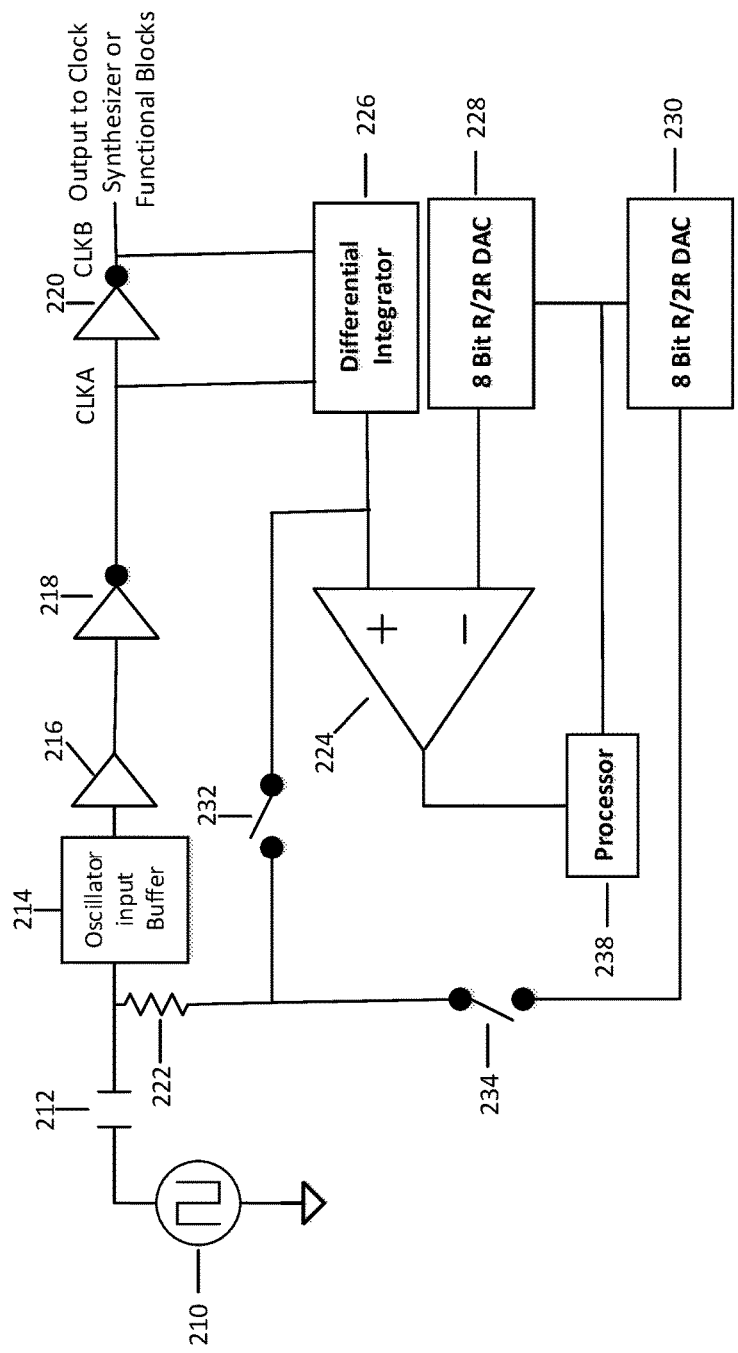
FIG. 2 is a schematic diagram of another exemplary system for controlling the duty cycle of a reference clock, according to another embodiment of the present disclosure.

FIG. 2 is a schematic diagram of another system for controlling the duty cycle of a reference clock, according to an embodiment of the present disclosure. The oscillator 210 provides a frequency source such as a reference clock to an oscillator input buffer 214 via a capacitor 212. The oscillator 210 may be a TCXO, a crystal oscillator or another clock source. The frequency of the oscillator 210 may change with temperature, the amount of the change depending on the type of oscillator used. The oscillator input buffer 214 amplifies the output of the oscillator 210 into a clock signal. According to an embodiment of the present disclosure, the oscillator input buffer 214 is an inverter with a large resistor between its input and output pins. The output of the oscillator input buffer 214 is supplied to buffer 216 which amplifies the clock signal to sharpen the edges of the clock signal which is then delivered to inverters 218 and 220. Without any correction from the duty cycle loop described in this application, the duty cycle of the buffered clock signal entering the inverter 218 may vary across a range of 45% to 55% depending on factors including oscillator 210 asymmetry, oscillator input buffer 214 asymmetry and buffer 216 asymmetry as well as the effects of parasitic impedances within the circuit path from the oscillator 210 to the inverter 220.

The present disclosure provides a circuit capable of correcting the duty cycle of the clock signal to 50%. The difference in output voltages of the inverters 218 and 220 are integrated by the differential integrator 226, whose principle of operation has been described above with respect to FIG. 1. If the duty cycle is not at 50%, there is a difference between the DC voltage levels at CLKA and CLKB and the differential integrator generates an output that rises or falls depending on whether the difference is positive or negative or whether the duty cycle is higher or lower than 50%. The output of the differential integrator 226 is then applied to the oscillator input buffer 214 via the resistor 222 to adjust its threshold. Since the rise and fall times of the oscillator 210 are not infinitely fast, a change in the threshold of the oscillator input buffer 214 has the effect of changing the duty cycle at the output of the oscillator input buffer 214. Therefore, when the feedback loop is closed, the negative feedback senses the difference in DC voltage levels at CLKA and CLKB, and drives that difference to zero. Since CLKA and CLKB have very fast and well-matched rise and fall times, the DC value of the two voltages at CLKA and CLKB are equal only when the duty cycle is exactly at 50%.

Integration of the outputs of the matched inverters 218 and 220 is performed by the differential integrator 226. The differential integrator 226 integrates the clock signal CLKB over time using the RC circuits as described in FIG. 1. The differential integrator 226 provides a biasing signal to change the switching threshold of the oscillator input buffer 214 as described above with respect to FIG. 1. Biasing the switching threshold of the oscillator input buffer 214 changes the duty cycle of the clock signal CLKB. At system power up, switch 232 is closed and switch 234 is opened allowing the differential integrator 226 to control the switching threshold and converge the duty cycle of the clock signal CLKB to 50%. After the duty cycle has converged to a steady state of 50%, a measurement of the threshold biasing signal is taken.

In an embodiment of the present disclosure, the threshold biasing measurement is taken by providing one input of the voltage comparator 224 with the threshold biasing signal from the output of the differential integrator 226 and providing the second input of the voltage comparator 224 with the output of a digital-to-analog converter (DAC) 228. For example, the DAC 228 includes, but is not limited to, an 8-bit R-2R resistor ladder. Processor 238 executes program code which cycles the DAC 228 through all possible values. As the first input to the voltage comparator 224 is a DC value, cycling through all DAC values of the DAC 228 produces a high or a low voltage at the output of the voltage comparator 224, depending on whether the DAC 228's output is higher or lower than the threshold biasing signal at the first input of the voltage comparator 224. The processor 238 executes program code that searches for the DAC value that causes the comparator 224 to switch from high to low (or from low to high, depending on which direction the search takes place). The DAC code when the transition at the output of comparator 224 is observed will be that code which gives a voltage at the output of the DAC that is closest to the output of the differential integrator. The processor 238 stores this value and also provides this value to DAC 230. For example, the DAC 230 includes, but is not limited to an 8-bit R-2R resistor ladder. According to an embodiment of the present disclosure, DAC 230 and DAC 228 may be the same component, in which case the voltage that goes to switch 234 is the same as the voltage that goes to the comparator 224.

After completion of the previously described calibration procedure, switch 234 is closed and switch 232 is opened. DAC 230 provides the steady state threshold biasing signal to the oscillator input buffer 214 through resistor 222 which maintains the 50% duty cycle of the clock signal while eliminating the noise contribution from the duty cycle loop. After calibration, the differential integrator 226 and the comparator 224 may also be powered off to save power.

In an embodiment of the present disclosure, the elements 210-238 are fabricated in close proximity to each other on the same die using a CMOS process to reduce parasitic impedances and noise which may introduce errors into the circuit.

While the present disclosure has been particularly shown and described with reference to certain embodiments thereof, it will be understood by those of ordinary skill in the art that various changes in forms and details may be made therein without departing from the spirit and scope of the present device and method as defined by the following claims and their equivalents.

What is claimed is:
1. A device comprising:
a buffer;
a first inverter electrically coupled to the buffer,
a second inverter electrically coupled to the first inverter; and
a differential integrator,
wherein an output of the first inverter is electrically coupled to a first input of the differential integrator,
wherein an output of the second inverter is electrically coupled to a second input of the differential integrator,
wherein an output of the differential integrator is electrically connected to the buffer, and
wherein a bias voltage is provided from a first digital to analog converter, the bias voltage being generated by comparing the output of the differential integrator to an output of a second digital to analog converter.

2. The device of claim 1, wherein the first inverter and the second inverter have outputs with matching rise and fall times.

3. The device of claim 1, wherein the outputs from the first inverter and the second inverters are integrated using resistive and capacitive components.

4. The device of claim 1, wherein the device produces a clock signal with a duty cycle of approximately 50%.

5. The device of claim 4, wherein the clock signal is provided as an input to a frequency doubling circuit.

6. The device of claim 5, wherein the frequency doubling circuit provides a higher reference frequency for a frequency synthesizer in a communication circuit.

7. The device of claim 6, wherein the communication circuit provides wireless communication within a mobile electronic device.

8. The device of claim 1, wherein the output from the differential integrator is measured and a measured value is stored in memory.

9. The device of claim 1, wherein electrical noise in the buffer is reduced by the bias voltage.

10. A method, comprising:
generating a buffered clock signal based on providing a clock signal to a buffer;
generating a first clock signal based on providing the buffered clock signal to a first inverter;
generating a second clock signal based on providing the first clock signal to a second inverter;
generating an output signal from a differential integrator based on providing a first voltage level of the first clock signal and a second voltage level of the second clock signal to the differential integrator; and
biasing a threshold of the buffer based on providing the output signal from the differential integrator to the buffer, wherein a bias voltage is provided from a first digital to analog converter, the bias voltage being generated by comparing the output signal from the differential integrator to an output signal of a second digital to analog converter.

11. The method of claim 10, wherein the clock signal is generated from a crystal oscillator.

12. The method of claim 10, wherein the buffer, the differential integrator, the first inverter and the second inverter are fabricated on a single semiconductor die.

13. The method of claim 10, wherein the first inverter and the second inverter have outputs with matching rise and fall times.

14. The method of claim 10, wherein the outputs from the first inverter and the second inverter are integrated using resistive and capacitive components.

15. The method of claim 10, wherein the second clock signal has a duty cycle of approximately 50%.

16. The method of claim 15, wherein the second clock signal is provided as an input to a frequency doubling circuit.

17. The device of claim 16, wherein the frequency doubling circuit provides a higher reference frequency for a frequency synthesizer in a communication circuit.

18. The device of claim 17, wherein the communication circuit provides wireless communication within a mobile electronic device.

19. The method of claim 10, wherein the output from the differential integrator is measured and the measured value is stored in memory.

20. The method of claim 10, wherein the differential integrator has a gain of at least 60 db, a DC offset less than 10 my and a unity gain bandwidth less than 5 MHz.

21. A device comprising:
a buffer;
a first switch;
a second switch;
a digital to analog converter (DAC); and
a differential integrator,
wherein, when the first switch is closed and the second switch is open, an output of the differential integrator provides a bias voltage to the buffer, and when the second switch is closed and the first switch is open, an output of the DAC provides the bias voltage to the buffer.

* * * * *

UNITED STATES PATENT AND TRADEMARK OFFICE
CERTIFICATE OF CORRECTION

PATENT NO.        : 9,762,211 B2                                    Page 1 of 1
APPLICATION NO.   : 14/994767
DATED             : September 12, 2017
INVENTOR(S)       : Chung Y. Lau It is certified that error appears in the above-identified patent and that said Letters Patent is hereby corrected as shown below:

Column 8 Line 54 in Claim 20, Line 3:
"10 my and a unity gain bandwidth less than 5 MHz."
Should be:
-- 10 mv and a unity gain bandwidth less than 5 MHz. --

Signed and Sealed this
Fifth Day of June, 2018

Andrei Iancu
*Director of the United States Patent and Trademark Office*